United States Patent
Akiyama et al.

(10) Patent No.: US 9,312,166 B2
(45) Date of Patent: Apr. 12, 2016

(54) METHOD FOR MANUFACTURING COMPOSITE WAFERS

(75) Inventors: Shoji Akiyama, Annaka (JP); Kazutoshi Nagata, Annaka (JP)

(73) Assignee: Shin-Etsu Chemical Co., Ltd. (JP)

( * ) Notice: Subject to any disclaimer, the term of this patent is extended or adjusted under 35 U.S.C. 154(b) by 34 days.

(21) Appl. No.: 14/343,515

(22) PCT Filed: Sep. 14, 2012

(86) PCT No.: PCT/JP2012/073629
§ 371 (c)(1),
(2), (4) Date: Jun. 24, 2014

(87) PCT Pub. No.: WO2013/039200
PCT Pub. Date: Mar. 21, 2013

(65) Prior Publication Data
US 2014/0308800 A1 Oct. 16, 2014

(30) Foreign Application Priority Data
Sep. 15, 2011 (JP) .................. 2011-201790

(51) Int. Cl.
*H01L 21/762* (2006.01)
*H01L 21/20* (2006.01)
*H01L 21/02* (2006.01)

(52) U.S. Cl.
CPC .... *H01L 21/76254* (2013.01); *H01L 21/02002* (2013.01); *H01L 21/2007* (2013.01); *H01L 21/2011* (2013.01); *H01L 21/76243* (2013.01); *H01L 21/76251* (2013.01)

(58) Field of Classification Search
CPC ..................... H01L 21/76254; H01L 21/2007; H01L 21/2011; H01L 21/76251; H01L 21/76243; H01L 21/02002

USPC .......................................... 438/406, 455, 458
See application file for complete search history.

(56) References Cited

U.S. PATENT DOCUMENTS

| | | | | |
|---|---|---|---|---|
| 5,349,207 A * | 9/1994 | Malhi | .............................. | 257/76 |
| 5,441,911 A * | 8/1995 | Malhi | .............................. | 438/285 |
| 6,482,677 B2 * | 11/2002 | Sato et al. | ..................... | 438/109 |
| 6,613,678 B1 | 9/2003 | Sakaguchi et al. | | |

(Continued)

FOREIGN PATENT DOCUMENTS

| EP | 2157602 A1 | 2/2010 |
|---|---|---|
| EP | 2357660 A1 | 8/2011 |

(Continued)

OTHER PUBLICATIONS

Supplementary European Search Report for Application No. EP 12 83 2334 dated Jan. 28, 2015, 3 pages.

(Continued)

*Primary Examiner* — John P Dulka
(74) *Attorney, Agent, or Firm* — Lerner, David, Littenberg, Krumholz & Mentlik, LLP

(57) ABSTRACT

This invention provides a method for manufacturing composite wafers in which at least two composite wafers can be obtained from one donor wafer, and in which the chamfering step can be omitted. Provided is a method for manufacturing composite wafers comprising: bonding surfaces of at least two handle wafers and a surface of a donor wafer which has a diameter greater than or equal to a sum of diameters of the at least two handle wafers and which has a hydrogen ion implantation layer formed inside thereof by implanting hydrogen ions from the surface of the donor wafer, to obtain a bonded wafer; heating the bonded wafer at 200° C. to 400° C.; and detaching a film from the donor wafer along the hydrogen ion implantation layer of the heated bonded wafer, to obtain the composite wafers having the film transferred onto the at least two handle wafers.

10 Claims, 3 Drawing Sheets

(56) References Cited

U.S. PATENT DOCUMENTS

| | | | |
|---|---|---|---|
| 6,727,549 B1* | 4/2004 | Doyle | 257/347 |
| 7,297,611 B2* | 11/2007 | Maleville | 438/458 |
| 7,851,332 B2* | 12/2010 | Yamazaki et al. | 438/463 |
| 8,268,699 B2* | 9/2012 | Park et al. | 438/455 |
| 2003/0170990 A1 | 9/2003 | Sakaguchi et al. | |
| 2009/0017581 A1 | 1/2009 | Tanaka | |
| 2009/0047771 A1* | 2/2009 | Yamazaki et al. | 438/458 |
| 2009/0166654 A1* | 7/2009 | Gan et al. | 257/98 |
| 2009/0170287 A1 | 7/2009 | Endo et al. | |
| 2010/0129951 A1* | 5/2010 | Henley | 438/57 |
| 2012/0234887 A1* | 9/2012 | Henley et al. | 225/1 |
| 2013/0200429 A1* | 8/2013 | Pan | 257/183 |

FOREIGN PATENT DOCUMENTS

| | | |
|---|---|---|
| JP | 2000036583 A | 2/2000 |
| JP | 2000294754 A | 10/2000 |
| JP | 2009044136 A | 2/2009 |
| JP | 4531694 B2 | 8/2010 |
| JP | 2010272853 A | 12/2010 |
| WO | 2004008527 A1 | 1/2004 |

OTHER PUBLICATIONS

International Search Report for Application No. PCT/JP2012/073629 dated Nov. 13, 2012, 2 pages.

* cited by examiner

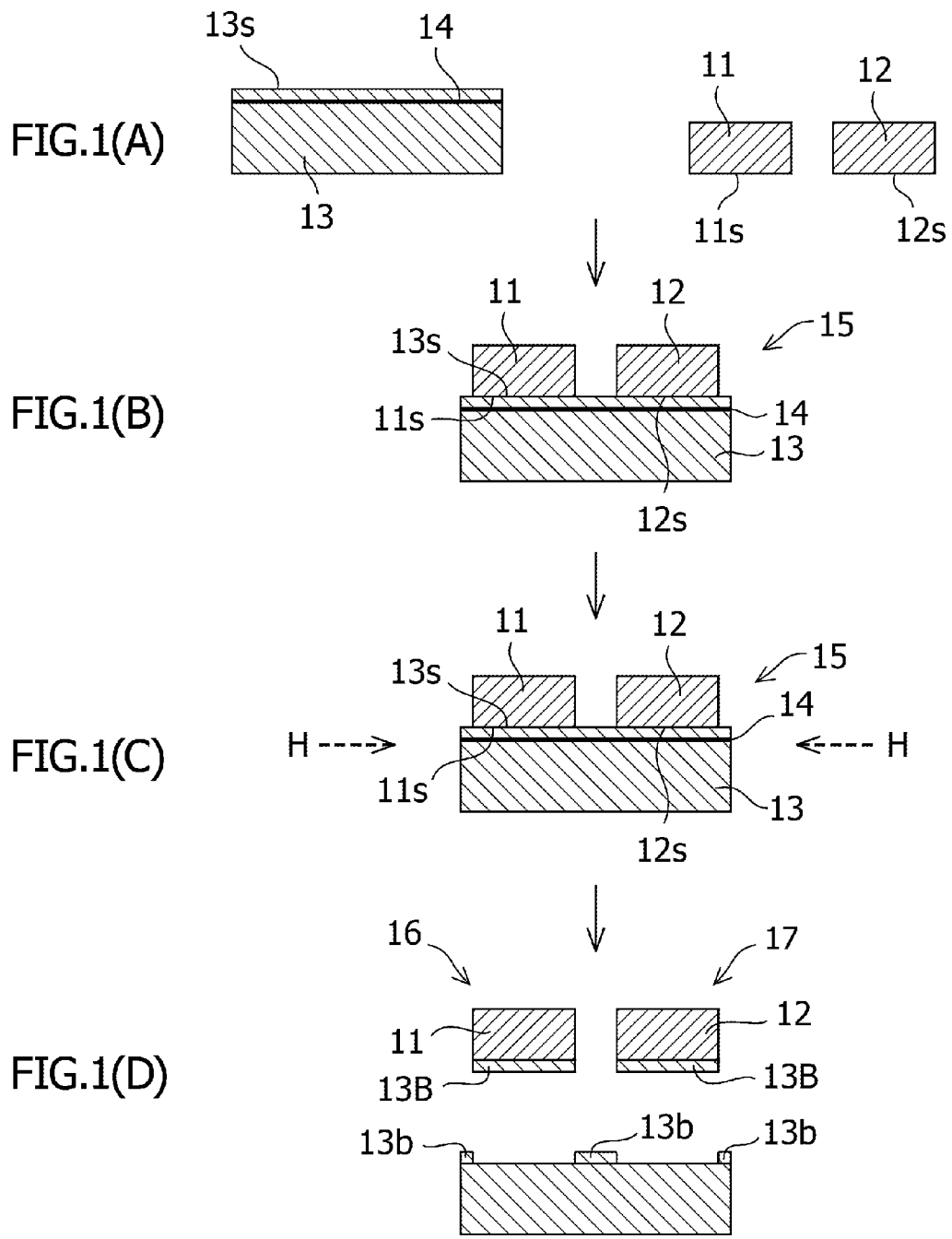

METHOD FOR MANUFACTURING COMPOSITE WAFERS

CROSS-REFERENCE TO RELATED APPLICATIONS

The present application is a national phase entry under 35 U.S.C. §371 of International Application No. PCT/JP2012/073629 filed Sep. 14, 2012, published in Japanese, which claims priority from Japanese Patent Application No. 2011-201790 filed Sep. 15, 2011, the disclosures of which are hereby incorporated by reference herein in their entirety.

TECHNICAL FIELD

The present invention relates to a method for manufacturing composite wafers.

BACKGROUND ART

In recent years, there has been a growing demand for composite wafers represented by silicon on insulator (SOI) wafers. Of the SOI wafers, "silicon on quartz (SOQ)" and "silicon on sapphire (SOS)" have attracted attention as wafers comprising insulating transparent wafers as handle wafers.

SOQ wafers are expected to be applied to optoelectronics utilizing high transparency of quartz, or high-frequency devices utilizing low dielectric loss of quartz. SOS wafers are expected to be applied to high-frequency devices which involve heat generation, because handle wafers comprise sapphire and thus have not only high transparency and low dielectric loss but also high thermal conductivity which is unattainable by glass or quartz.

Such a composite wafer is typically produced by bonding two wafers (a donor wafer and a handle wafer). An SOS wafer can also be obtained by epitaxially growing silicon directly on r-plane of sapphire. Its crystal quality, however, usually falls short of bulk silicon because the lattice constant differs between sapphire and silicon.

At present, the diameters of a silicon wafer and a sapphire wafer are mainly 6 to 12 inches and 2 to 4 inches, respectively. For example, in the case of producing a 2-inch SOS wafer, a 2-inch silicon wafer needs to be prepared. However, it is currently very difficult to acquire a 2-inch silicon wafer. In the field of silicon devices, both a trend toward larger diameter and a trend toward finer structure of wafer have been ongoing. Accordingly, when attempting to obtain a wafer of excellent quality, it is inevitable to select a silicon wafer of a large diameter.

Patent Document 1 describes use of a handle wafer and a donor wafer larger than the handle wafer to allow a transferred layer to have an increased area. In Patent Document 1, however, one donor wafer is bonded to one handle wafer, so that it has to be subjected to primary chamfering and secondary chamfering on both of the wafers.

PRIOR ART DOCUMENTS

[Patent Document 1] Japanese Patent No. 4531694

SUMMARY OF THE INVENTION

Problems to be Solved by the Invention

In the technique of two-stage chamfering in Patent Document 1, the chamfering quality of both wafers affects the bonding quality. This is because roughness in the periphery of the chamfered portion prevents the periphery from being bonded properly. Hence, the step of chamfering requires significant cost and time.

Besides, Patent Document 1 describes the feature of using a donor wafer which is slightly larger in diameter than a handle wafer. However, apparatus for wafer processing and semiconductor process are normally suitable only for wafers according to standards defined in SEMI, JEIDA, and the like having a diameter of 2 inches (50 to 50.8 mm), a diameter of 3 inches (76 to 76.2 mm), a diameter of 4 inches (100 mm), a diameter of 5 inches (125 mm), a diameter of 6 inches (150 mm), a diameter of 8 inches (200 mm), a diameter of 12 inches (300 mm), and the like. Therefore, it is very difficult to use a wafer of an irregular size, providing also a practical problem that significant cost is required for modification of existing apparatus and the like.

The present invention has been made in view of the above-mentioned circumstances, and provides a method for manufacturing composite wafers in which a plurality of composite wafers can be obtained from one donor wafer, and in which the step of chamfering can be omitted.

Means for Solving the Problems

To solve the problems stated above, in an aspect of the present invention, provided is a method for manufacturing composite wafers comprising at least the steps of: bonding surfaces of at least two handle wafers and a surface of a donor wafer which has a diameter greater than or equal to a sum of diameters of the at least two handle wafers and which has a hydrogen ion implantation layer formed inside thereof by implanting hydrogen ions from the surface of the donor wafer, to obtain a bonded wafer; heating the bonded wafer at 200° C. to 400° C.; and detaching a film from the donor wafer along the hydrogen ion implantation layer of the heated bonded wafer, to obtain the composite wafers having the film transferred onto the at least two handle wafers.

Advantageous Effect of the Invention

The method for manufacturing composite wafers according to the present invention can result in a plurality of composite wafers from one donor wafer, while omitting a step of chamfering.

BRIEF DESCRIPTION OF THE DRAWINGS

FIG. 1 is a diagram showing an embodiment of steps in a method for manufacturing composite wafers.

MODE FOR CARRYING OUT THE INVENTION

Figure 2A:
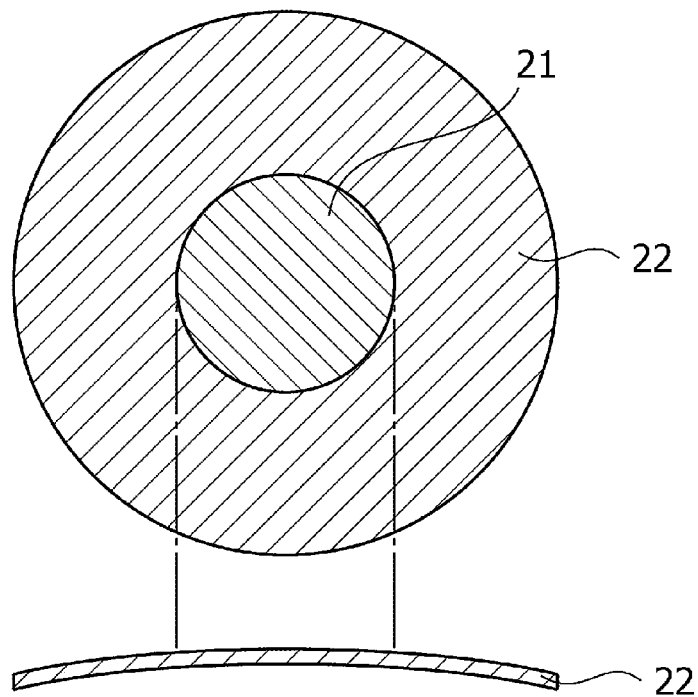
FIG. 2 shows cross sectional views of composite wafers, indicating warping of donor wafers when one handle wafer in FIG. 2(A) or two handle wafers in FIG. 2(B) are bonded to one donor wafer and heated.

At least two handle wafers used in the present invention are preferably made of a material selected from the group consisting of a silicon wafer, a glass wafer, a quartz wafer, a sapphire wafer, a silicon carbide wafer, and a gallium nitride wafer. Each of the at least two handle wafers is preferably subjected to cleaning such as RCA cleaning before the below-mentioned step of bonding. Though each of the at least two handle wafers may be selected wafers made of different materials, it is preferable to select wafers made of the same material in view of the below-mentioned steps of bonding and heating.

Each of the diameters of at least two handle wafers is preferably 2 to 6 inches, more preferably 2, 3, 4, or 6 inches. Such a diameter enables at least two or more composite wafers to be produced simultaneously. It is also possible to produce many composite wafers at one time, by combining handle wafers of different diameters.

A donor wafer used in the present invention is preferably made of a material selected from the group consisting of a silicon wafer, a glass wafer, a quartz wafer, a sapphire wafer, a silicon carbide wafer, and a gallium nitride wafer.

The diameter of the donor wafer is greater than or equal to the sum of the diameters of the at least two handle wafers. That is, the diameter of the donor wafer is not less than twice the diameter of a handle wafer. The diameter of the donor wafer is preferably not more than six times the diameter of a handle wafer.

The diameter of the donor wafer is preferably 6 to 12 inches, more preferably 6, 8, or 12 inches. Such a diameter enables at least two or more composite wafers to be produced simultaneously.

Since the size of the donor wafer used in the present invention is not less than twice the size of the handle wafer as mentioned above, a step of chamfering the donor wafer can be omitted. This is because the chamfered portion of the donor wafer, which could cause defective bonding, is far away from the bonding area and thus does not affect the bonding quality.

A method for manufacturing composite wafers according to the present invention will be explained with reference to FIGS. 1 and 2. However, it should not be construed that the present invention is limited to or by them.

FIG. 1 is a diagram showing an embodiment of steps in a method for manufacturing composite wafers according to the present invention. An embodiment in a method for manufacturing two composite wafers from one donor wafer and two handle wafers is shown in FIG. 1.

First, as shown in FIG. 1(A), hydrogen ions are implanted from a surface 13s of a donor wafer 13 having the diameter of not less than twice the sum of the diameters of handle wafers 11 and 12, to form a hydrogen ion implantation layer 14 inside of the donor wafer 13. Next, as shown in FIG. 1(B), the ion-implanted surface 13s of the donor wafer 13 is bonded to respective surfaces 11s and 12s of the two handle wafers 11 and 12, to obtain a bonded wafer 15.

As shown in FIG. 1(A), when the hydrogen ion implantation layer 14 is formed by implanting hydrogen ions from the surface 13s of the donor wafer 13, the temperature of the donor wafer 13 is set, for example, to 250 to 400° C., and hydrogen ions of a predetermined dose amount are implanted with such implantation energy as to enable hydrogen ions to be implanted to a desired depth from the surface. Conditions in this case may be, for instance, that the implantation energy is 50 to 100 keV and the implantation dose amount is $2 \times 10^{16}$ to $1 \times 10^{17}/cm^2$.

The implanted hydrogen ions are preferably hydrogen ions ($H^+$) of a dose amount of $2 \times 10^{16}$ to $1 \times 10^{17}$ atoms/cm$^2$ or hydrogen molecular ions ($H_2^+$) of a dose amount of $1 \times 10^{16}$ to $5 \times 10^{16}$ atoms/cm$^2$. Hydrogen ions ($H^+$) of a dose amount of $8.0 \times 10^{16}$ atoms/cm$^2$ or hydrogen molecular ions ($H_2^+$) of a dose amount of $4.0 \times 10^{16}$ atoms/cm$^2$ are particularly preferable, because an implantation layer produced in such a dose amount exhibits suitable brittleness in a subsequent step detaching for transfer.

The depth from the surface 13s of the donor wafer 13, from which hydrogen ions is implanted, to the hydrogen ion implantation layer 14 depends on a desired thickness of a film 13B to be provided on the handle wafers 11 and 12, and is preferably 300 to 500 nm and more preferably about 400 nm. The thickness of the hydrogen ion implantation layer 13 is, from the viewpoint of facilitating detachment by a mechanical impact, preferably 200 to 400 nm, more preferably about 300 nm.

The donor wafer 13 is not limited to the above embodiments, and may include a silicon wafer having an oxide film formed on the surface 13s. Using such a silicon wafer having an oxide film formed on the surface 13s and implanting ions through the oxide film can bring an advantageous effect of suppressing channeling of implanted ions, thereby reducing variations in ion implantation depth. Consequently, a film with high thickness uniformity can be formed. Here, the oxide film may be formed by a typical thermal oxidation method. The oxide film is typically obtained by heating at 800 to 1100° C. under normal pressure in an oxygen atmosphere or a water-vapor atmosphere. Implanting hydrogen ions through the oxide film can bring an advantageous effect of suppressing channeling of implanted ions.

The thickness of the oxide film is preferably 50 to 500 nm. If the oxide film is too thin, it may be difficult to control the thickness of the oxide film. If the oxide film is too thick, it may take too long to form the oxide film.

Before the step of bonding, it is preferable to subject the surface 13s of the donor wafer 13 and/or the respective surfaces 11s and 12s of the handle wafers 11 and 12 to a surface activation treatment. Subjection to the surface activation treatment can bring such a bonding strength as to sufficiently withstand subsequent mechanical detachment and the like.

For example, the surface activation treatment may include use of a plasma device comprising an upper electrode and a lower electrode which are opposed to each other with a space there between. Typically, in the surface activation treatment of using a plasma device, the donor wafer or each of the handle wafers is placed on the upper surface of the lower electrode, a process gas is introduced, and high-frequency power is applied to at least one of the upper electrode and the lower electrode to form a high-frequency electric field across the electrodes. Plasma of the process gas is generated by this high-frequency electric field, to subject a surface of the donor wafer or respective surfaces of the handle wafers to plasma-treatment.

Typically, in the plasma treatment of the surface, the donor wafer or the handle wafers are placed in a vacuum chamber, and subjected to introduction of the process gas, and exposure to high-frequency plasma of preferably about 100 W for about 5 to 30 seconds. For example, in the treatment of a silicon wafer having an oxide film formed on its surface, the process gas is preferably plasma of oxygen gas. In the treatment of a silicon wafer having no oxide film formed on its surface, the process gas is preferably hydrogen gas, argon gas, a mixed gas of hydrogen and argon, or a mixed gas of hydrogen and helium. Nitrogen gas, which is an inert gas, is also applicable. Any gas may be used in the treatment of the other donor wafers or handle wafers.

As a result of the above-mentioned plasma treatment for the surface activation, the wafer surface subjected to the activation treatment is activated, for example, owing to increase in OH group. Closely attaching the surface of the donor wafer to the surfaces of the handle wafers in the activated state allows the wafers to be bonded more strongly through hydrogen bonding and the like. The advantageous effect of the plasma treatment can be obtained similarly by the other surface activation treatment such as an UV treatment or an ozone treatment.

Next, as shown in FIG. 1(C), the bonded wafer 15 is subjected to heating H at a temperature of 200 to 400° C. The heating time is determined according to the heating temperature and the material, and is preferably selected from a range of 1 to 24 hours. An excessively high heating temperature or an excessively long heating time may cause cracking, peeling or the like. By heating the bonded wafer 15 in this way, it is possible to increase the bonding strength of the donor wafer 13 and the handle wafers 11 and 12. As a result of increasing the bonding strength, defects in the subsequent step of detaching can be reduced. The step of heating may be preferably carried out in the presence of argon, nitrogen, helium, or a mixed gas of two or more gases thereof.

Figure 2B:
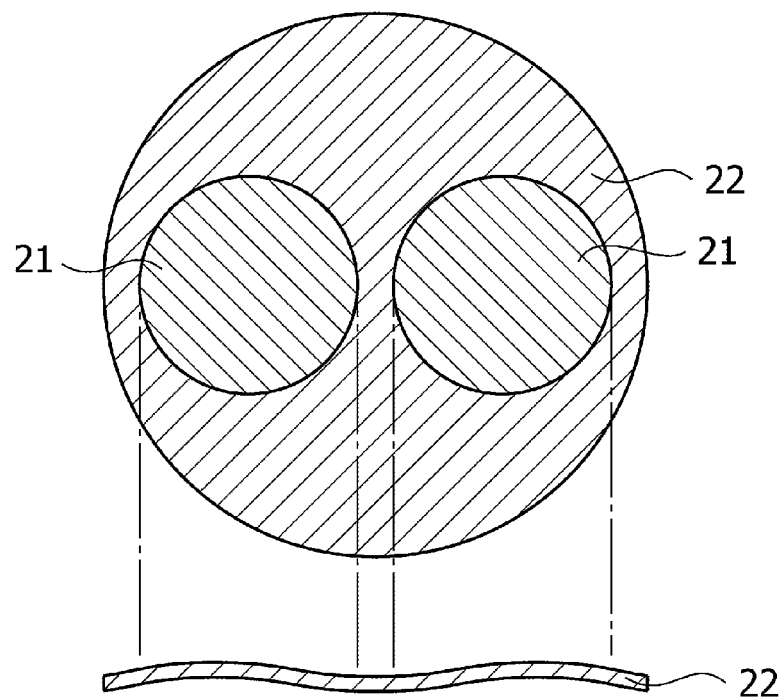

When at least two handle wafers are bonded to one donor wafer, a stress is generated during heating owing to a difference in thermal expansion coefficient. FIG. 2 shows cross sectional views of composite wafers, indicating warping of a donor wafer 22 when one handle wafer 21 in FIG. 2(A) or two handle wafers 21 in FIG. 2(B) are bonded to one donor wafer 22 and heated. Note that the handle wafers are not shown in the cross sectional views. When one handle wafer is bonded to one donor wafer as shown in FIG. 2(A), a stress distribution is concentric with the handle wafer, and thus the donor wafer is uniformly stressed. On the other hand, when two handle wafers are bonded to one donor wafer as shown in FIG. 2(B), a stress distribution is not concentric with the handle wafers, and thus the donor wafer is highly stressed. This could cause a problem of peeling of the bonded handle wafers. However, the above-mentioned surface activation treatment prevents such a problem because the bonding strength is increased.

Next, as shown in FIG. 1(D), the film 13B on the handle wafers 11 and 12 is detached along the hydrogen ion implantation layer 14, to obtain composite wafers 16 and 17 in which the film 13B has been transferred onto the handle wafers 11 and 12. Thus, the composite wafers 16 and 17 can be obtained by detachment for transferring the film 13B. Meanwhile, an unbonded film portion 13b remains on the donor wafer. The below-mentioned irradiation with visible light through a transparent side of the bonded wafer can facilitate the unbonded film portion 13b to be left on the donor wafer more easily by controlling the range of irradiation with visible light.

When the donor wafer and/or the handle wafers are transparent, the step of detaching preferably comprises irradiation with visible light through the transparent side of the bonded wafer. Moreover, when the handle wafers are a glass wafer, a quartz wafer or a sapphire wafer, the step of detaching preferably comprises irradiation with visible light through a handle wafer side of the bonded wafer. This method enables detaching by a mechanism that, since silicon near the ion implantation interface formed inside of the donor wafer is amorphized, visible light is absorbed easily, thereby making selective receipt of energy easy. This irradiation detachment is preferable in viewpoint of operational ease than mechanical detachment.

A light source of the visible light is preferably a light source of a rapid thermal annealer (RTA), a green laser light, or a flash lamp light.

In a different method of detaching, mechanical detachment of applying an impact to the hydrogen ion implantation layer 14 has no possibility of causing heat-induced defects such as thermal strain, cracking, and peeling of bonded surfaces. Mechanical detachment is preferably made by cleavage from one end to the other end. The detachment may comprise inserting a cleavage member, preferably a wedge-shaped member such as a wedge along the hydrogen ion implantation layer 14 (implantation interface) and allowing cleavage to progress through deformation by the wedge. Upon using this method, it is necessary to prevent generation of scratches or particles in the portion contacted by the wedge, and substrate cracking due to excessive wafer deformation caused by driving the wedge into the wafer.

In the other method of detaching, when the handle wafers are selected from glass, quartz and sapphire wafers, the step of detaching preferably comprises applying a mechanical impact to the hydrogen ion implantation layer 14 with the cleavage member attached while irradiating visible light through a handle wafer side of the bonded wafer. This method can bring synergetic advantageous effects through the optical detachment by light irradiation and the mechanical detachment.

Application of an impact to the hydrogen ion implantation layer 14 includes, but not limited to, continuous or intermittently spray of a jet of fluid such as gas or liquid from a side of the bonded wafer. Any other methods are applicable so long as mechanical detachment is caused by an impact.

The composite wafers 16 and 17 can be produced as a result of the above-mentioned steps.

Figure 3:
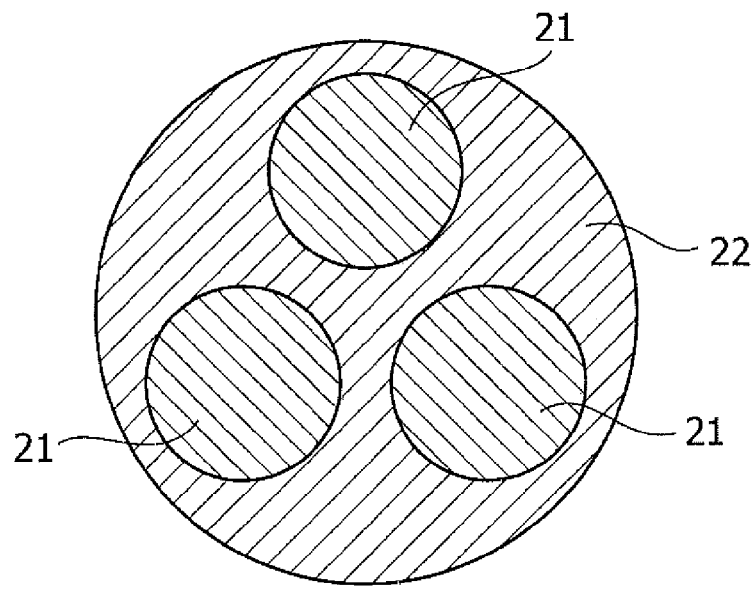
FIG. 3 is a diagram showing an embodiment where three handle wafers are used for one donor wafer.
Figure 4:
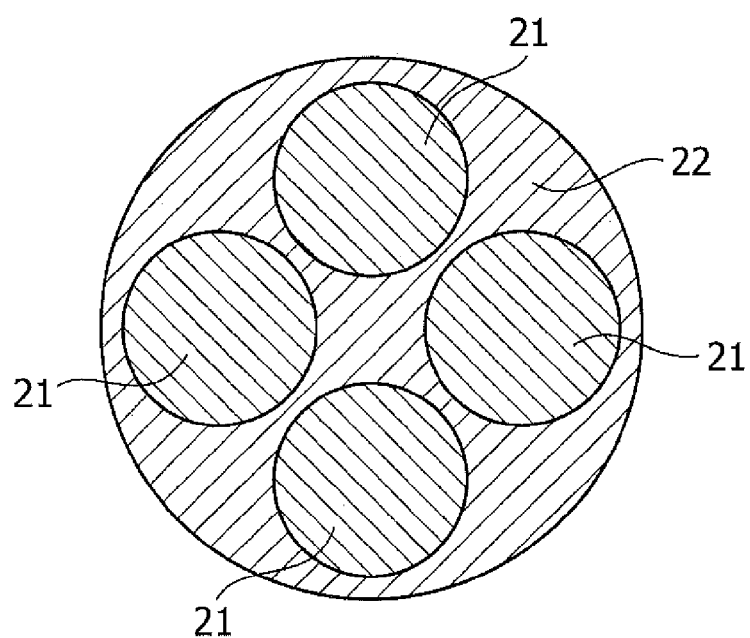
FIG. 4 is a diagram showing an embodiment where four handle wafers are used for one donor wafer.

As described above, in the method for manufacturing composite wafers according to the present invention, at least two composite wafers can be obtained from one donor wafer, while omitting the step of chamfering the donor wafer. Moreover, a major cost reduction can be achieved because at least two composite wafers can be obtained from one donor wafer. Production of two composite wafers from one donor wafer and two handle wafers is described in this specification as an embodiment of the method for manufacturing composite wafers according to the present invention. The method for manufacturing composite wafers according to the present invention is applicable to three handle wafers (FIG. 3), four handle wafers (FIG. 4), or five or more handle wafers with respect to one donor. The method for manufacturing composite wafers according to the present invention is applicable to a combination of at least two handle wafers of different diameters.

EXAMPLES

The present invention will be explained in detail based on Examples and Comparative Examples. It should not be construed that the present invention is limited to or by them.
Comparison Tests in Presence or Absence of a Surface Activation Treatment in Use of Wafers of Different Thermal Expansion Coefficients In Test Example 1, two 2-inch sapphire wafers were bonded onto a 6-inch silicon wafer having an oxide film of 50 nm in thickness grown thereon, and the obtained bonded wafer was heated at 250° C. for 24 hours.

In Test Example 2, two 2-inch sapphire wafers whose surfaces had been subjected to a plasma activation treatment were bonded to a 6-inch silicon wafer having an oxide film of 50 nm in thickness grown thereon, and the obtained bonded wafer was heated at 250° C. for 24 hours.

In Test Example 1, the sapphire wafers peeled off the silicon wafer, and the silicon wafer was damaged. In Test Example 2, on the other hand, the sapphire wafers were strongly bonded to the silicon wafer. These results demonstrate that the bonding strength can be increased by the surface activation treatment before bonding of the sapphire wafers to the silicon wafer.

Example 1

Three 2-inch sapphire wafers were bonded onto an unchamfered 6-inch silicon wafer having an oxide film of 50 nm in thickness grown thereon and having hydrogen ions of a dose amount of $7.0 \times 10^{16}$ atoms/cm$^2$ implanted with energy of an acceleration voltage of 50 KeV. After the obtained bonded wafer was heated at 250° C. for 24 hours, a wedge was inserted along the ion implantation interface for mechanical detachment.

It was confirmed in the obtained composite wafers that a silicon film was transferred onto the sapphire wafers. The result demonstrates that the lack of chamfering the silicon wafer does not affect the transferring of silicon film.

Example 2

Two 2-inch sapphire wafers were bonded onto an unchamfered 4-inch silicon wafer having an oxide film of 50 nm in thickness grown thereon and having hydrogen ions of a dose amount of $7.0 \times 10^{16}$ atoms/cm$^2$ implanted with energy of an acceleration voltage of 50 KeV. After the obtained bonded wafer was heated at 250° C. for 24 hours, a strong visible light was irradiated through the sapphire wafer side of the bonded wafer to detach a silicon film along the ion implantation interface of the bonded wafer. Light sources of the visible light were those of an RTA, a green laser light, and a flash lamp light.

It was confirmed in all of the light sources that a silicon film was successfully transferred onto the sapphire wafers. These results demonstrate that the lack of chamfering the silicon wafer does not affect the transferring of silicon film.

Example 3

Two 2-inch sapphire wafers were bonded onto an unchamfered 4-inch silicon carbide wafer having an oxide film of 50 nm in thickness grown thereon by CVD and having hydrogen ions of a dose amount of $9.8 \times 10^{16}$ atoms/cm$^2$ implanted with energy of an acceleration voltage of 70 KeV. After the obtained bonded wafer was heated at 250° C. for 24 hours, a wedge was inserted along the ion implantation interface for mechanical detachment.

It was confirmed in the obtained composite wafers that a silicon film was transferred onto the sapphire wafers. The result demonstrates that the lack of chamfering the silicon wafer does not affect the transferring of silicon film.

DESCRIPTION OF REFERENCE NUMERALS 11, 12 handle wafer
11s, 12s surface
13 donor wafer
13s surface
13B film
13b unbonded film portion
14 hydrogen ion implantation layer
15 bonded wafer
16, 17 composite wafer
21 handle wafer
22 donor wafer

The invention claimed is:

1. A method for manufacturing composite wafers comprising at least the steps of:
    bonding surfaces of at least two handle wafers and a surface of a donor wafer which has a diameter greater than or equal to a sum of diameters of the at least two handle wafers and which has a hydrogen ion implantation layer formed inside thereof by implanting hydrogen ions from the surface of the donor wafer, to obtain a bonded wafer;
    heating the bonded wafer at 200° C. to 400° C.; and
    detaching a film from the donor wafer along the hydrogen ion implantation layer of the heated bonded wafer, to obtain the composite wafers having the film transferred onto the at least two handle wafers,
    wherein the diameter of the donor wafer is 4 inches to 12 inches, and the diameter of each of the at least two handle wafers is 2 inches to 6 inches.

2. The method for manufacturing composite wafers according to claim 1, wherein the diameter of the donor wafer is 6 inches to 12 inches, and each of the diameters of the at least two handle wafers is 2 inches to 6 inches.

3. The method for manufacturing composite wafers according to claim 1, wherein the surface of the donor wafer and/or the surfaces of the at least two handle wafers have been subjected to a surface activation treatment.

4. The method for manufacturing composite wafers according to claim 1, wherein each of the donor wafer and the at least two handle wafers is selected from the group consisting of a silicon wafer, a silicon wafer having an oxide film formed thereon, a glass wafer, a quartz wafer, a sapphire wafer, a silicon carbide wafer, and a gallium nitride wafer.

5. The method for manufacturing composite wafers according to claim 4, wherein the donor wafer is a silicon wafer or a silicon wafer having an oxide film formed thereon, and each of the at least two handle wafers is a glass wafer, a quartz wafer, or a sapphire wafer.

6. The method for manufacturing composite wafers according to claim 1, wherein the donor wafer and/or the at least two handle wafers are transparent, and the step of detaching comprises irradiating visible light through a transparent side of the bonded wafer.

7. The method for manufacturing composite wafers according to claim 6, wherein a light source of the visible light is a light source of a rapid thermal annealer, a laser, or flash lamp light.

8. The method for manufacturing composite wafers according to claim 1, wherein each of the at least two handle wafers is a glass wafer, a quartz wafer, or a sapphire wafer, and the step of detaching comprises irradiating visible light through an at least two handle wafer side of the bonded wafer.

9. The method for manufacturing composite wafers according to claim 1, wherein each of the at least two handle wafers is a glass wafer, a quartz wafer, or a sapphire wafer, and the step of detaching comprises applying a mechanical impact to the hydrogen ion implantation layer of the bonded wafer.

10. The method for manufacturing composite wafers according to claim 1, wherein each of the at least two handle wafers is a glass wafer, a quartz wafer, or a sapphire wafer, and the step of detaching comprises applying a mechanical impact to the hydrogen ion implantation layer with a cleavage member attached while irradiating visible light through an at least two handle wafer side of the bonded wafer.

* * * * *